United States Patent
Stobie et al.

(10) Patent No.: US 10,827,135 B2
(45) Date of Patent: Nov. 3, 2020

(54) BDI BASED PIXEL FOR SYNCHRONOUS FRAME-BASED AND ASYNCHRONOUS EVENT-DRIVEN READOUTS

(71) Applicant: BAE Systems Information and Electronic Systems Integration Inc., Nashua, NH (US)

(72) Inventors: James A. Stobie, Duxbury, MA (US); R. Daniel McGrath, Lexington, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/199,911

(22) Filed: Nov. 26, 2018

(65) Prior Publication Data
US 2020/0169675 A1    May 28, 2020

(51) Int. Cl.
| | | |
|---|---|---|
| H04N 5/33 | (2006.01) | |
| H04N 5/378 | (2011.01) | |
| H04N 5/3725 | (2011.01) | |
| H04N 5/3745 | (2011.01) | |
| H01L 27/146 | (2006.01) | |

(52) U.S. Cl.
CPC ......... *H04N 5/33* (2013.01); *H01L 27/14609* (2013.01); *H04N 5/378* (2013.01); *H04N 5/3725* (2013.01); *H04N 5/3745* (2013.01)

(58) Field of Classification Search
CPC .... H04N 5/374–37457; H04N 5/3745–37455; H04N 5/378; H04N 5/3355; H04N 5/332
USPC ............................... 348/308, 166; 250/208.1
See application file for complete search history.

(56) References Cited

U.S. PATENT DOCUMENTS

| | | | |
|---|---|---|---|
| 9,047,818 B1 * | 6/2015 | Day | G09G 3/3233 |
| 9,215,386 B2 | 12/2015 | Elkind | |
| 2010/0102206 A1 * | 4/2010 | Cazaux | H01L 27/14603 |
| | | | 250/208.1 |
| 2010/0182468 A1 | 7/2010 | Posch | |
| 2010/0226495 A1 * | 9/2010 | Kelly | H04N 5/378 |
| | | | 380/30 |
| 2010/0328501 A1 * | 12/2010 | De Groot | H04N 5/35572 |
| | | | 348/262 |

(Continued)

FOREIGN PATENT DOCUMENTS

| | | | |
|---|---|---|---|
| WO | 2016053764 A1 | 4/2016 | |
| WO | WO-2016053764 A1 * | 4/2016 | G06K 9/00986 |

OTHER PUBLICATIONS

Empower 4875: Event-Driven Image Sensors for Defense Applications, Jim Stobie, Dan McGrath, BAE Systems, Dec. 16, 2016, 41 pages.

(Continued)

*Primary Examiner* — Xi Wang
(74) *Attorney, Agent, or Firm* — Miane Cernota & Rardin; Scott J. Asmus

(57) ABSTRACT

A hybrid frame-based and event driven pixel, the pixel comprising a frame-based capture circuit, an event-driven capture circuit, and a photodiode in electrical communication with both the frame-based and event-driven capture circuits, wherein the frame based capture circuit is a buffered direct injection circuit, and wherein the event-driven capture circuit is a dynamic vision system circuit.

19 Claims, 7 Drawing Sheets

(56) References Cited

U.S. PATENT DOCUMENTS

| | | | | |
|---|---|---|---|---|
| 2011/0304758 A1* | 12/2011 | Eldesouki | .......... | H04N 5/37452 348/308 |
| 2011/0313407 A1* | 12/2011 | Rafailov | ................ | B01J 19/121 606/2 |
| 2012/0224083 A1* | 9/2012 | Jovanovski | ........ | G06K 7/10722 348/231.99 |
| 2015/0009337 A1* | 1/2015 | Minlong | .............. | H04N 5/3745 348/166 |
| 2016/0165159 A1* | 6/2016 | Hseih | ................ | H04N 5/37457 348/273 |

OTHER PUBLICATIONS

YouTube video entitled Driving alghero with apsDVS sensor SBRet10, Published Jun. 30, 2013. Retrieved from internet: https://youtu.be/hbWyDFrZVc4.

"Boahen, K. A. (2000). Point-to-point connectivity between neuromorphic chips using address events, Copyright 2000 IEEE. Reprinted from IEEE Transactions on Circuits and Systems II: Analog and Digital Signal Processing, vol. 47, Issue 5, May 2000,pp. 416-434.Publisher URL: http://ieeexplore.ieee.org/xpl/tocresult.jsp?isNumber=182248,puNumber=82 ".

A low power CMOS Imager based on TFS encoding and Fair AER, Shoushen, IEEE 2005.

A 128x128 120dB 15us Latency Asynchronous Temporal Contrast Vision Sensor, Lichtsteiner, IEEE 2008.

Posch et al, How Neuromorphic Image Sensors Steal Tricks From the Human Eye, IEEE Spectrum, Nov. 26, 2015, 4 pages.

A QVGA 143 dB Dyn. R. Frame-free PWM IS with Lossless Piexl-Level Video Comp. and Time-domain CDS, Porsch 2011, IEEE.

240x180 130dB 18.5um 3us Latency GS_Spatiotemporal Vision Sensor Davis—Brandli 2014.

Fesquet; Laurent et al; Low-Power Event-driven Image Sensor Architectures, SIGNAL 2016 First International Conference on Advances in Signal, Image and Video Processing Jun. 26-30, 2016—Lisbon, Portugal, 46 pages.

YouTube video entitled CeleX Dynamic Vision Sensor(384) for Computer Vision, published Aug. 2, 2016. Retrieved from Internet: https://youtu.be/Wlzc-5sgm1g.

YouTube video entitled CeleX Dynamic Vision Sensor in Action, published May 2, 2016. Retrieved from internet: https://youtu.be/VyXeeX21m5g.

YouTube Video entitled DAVIS240 IMU stabilization examples outdoors and cross target, Published Nov. 5, 2015. Retrieved from Internet: https://youtu.be/Tzy4WF6Qp-Y.

Bluzer et al., Buffered Direct Injection of Photocurrents into Charge-Coupled Devices, IEEE Journal of Solid-State Circuits, Feb. 1978, pp. 86-92, vol. SC-13, No. 1.

Berner et al., A 240x180 120dB 10mW 12us-latency sparse output vision sensor for mobile applications, pp. 1-4, Inst. of Neuroinformatics, University of Zurich and ETH Zurich.

International Search Report, PCT/US2019/063166, dated Jan. 9, 2020, 10 pages.

\* cited by examiner

BDI BASED PIXEL FOR SYNCHRONOUS FRAME-BASED AND ASYNCHRONOUS EVENT-DRIVEN READOUTS

FIELD

The present disclosure relates to pixels, and more particularly, to Buffered Direct Injection (BDI) based pixels for synchronous frame-based & asynchronous event-driven readouts.

BACKGROUND

Frame-based imagers, which may also be referred to herein as conventional or synchronous operation imagers, are based on the use of a fixed capture interval. In such imagers, a Region of Interest (ROI) on a Focal Plane Array (FPA) or the entire array of pixels is read out at every frame. The readout of frame-based imagers includes both spatial and temporal redundancies, as not all data has changed between frames. This replication of data and readout of more information than necessary results in data bottlenecks for large format high frame rate imagers. Furthermore, reading out the entire array every frame results in high storage and power dissipation requirements, with much of the power being wasted transferring redundant information off of the FPA.

As imaging formats and frame rates continue to rise, power dissipation of imaging components becomes a real concern, especially for man-portable devices, Unmanned Aerial Vehicles (UAVs), and low power surveillance systems, which typically utilize such frame-based imagers.

Asynchronous readouts, which may also be referred to herein as event-driven, are making inroads for machine vision applications by capturing scene dynamics as they appear, allowing for substantially reduced power dissipation and storage requirements. These event-driven readouts accomplish this power savings and minimization of storage requirements by avoiding reading out spatial and temporal redundancies in the scene. These benefits, however, come at the expense of not capturing the scene's detailed contextual contents, which are often necessary for navigation and to identify potential targets of interest within the scene.

While some potential solutions combining event-driven and frame based pixel technology have been offered, these solutions come with disadvantages compared to that of the present disclosure. For instance, one prior art device, which is known as an "Asynchronous Time Based Sensor" or ATIS 100, a schematic of which is provided in FIG. 1, uses a monolithic, silicon-based construction (i.e. photodiodes in the pixel array are silicon-based fabricated in same wafer as Complementary Metal Oxide Semiconductor (CMOS) circuitry), requires two photodiodes, each having their own in-pixel circuitry (one circuit being a Dynamic Vision System (DVS) circuit 102 and the other being a Time-Based Correlated double sampling (CDS) circuit 104), which results in a large unit cell that makes it unsuitable for many applications (the unit cell comprises 77 FETS, 2 capacitors, and 2 photodiodes, which occupy ~30% of the available unit cell space), and only allows for non-simultaneous readout of event and frame based data. This design is not compatible with small pixels.

Other existing solutions for combining event-driven logarithmic response inputs with frame based imaging that allow simultaneous asynchronous and synchronous operation, including one referred to as a "Dynamic and Active-Pixel Vision Sensor" or DAVIS 200, which combines a DVS circuit 102 with an Active-Pixel Sensor (APS) circuit 202, a schematic of which is provided in FIG. 2, have concentrated on the commercial market for visible imagers, targeting machine vision and driver assistance aids. Like the ATIS 100 shown in FIG. 1, these other commercial offerings are also monolithic, using photo-diodes fabricated in a CMOS substrate, and a visible APS 202 style input for the frame-based readout. Integration capacitance of these designs at the reset drain ($V_{dr}$) and the floating diffusion node of the Active Pixel Sensor ($V_{aps}$) 202 are small, based on parasitic elements designed for high sensitivity and limited charge capacities associated with visible imaging. These small capacitances introduce non-linearity into the pixel, degrading thermal imaging performance.

Such designs are not capable of achieving low light sensitivity and are therefore limited to machine vision and driver aid applications. Furthermore, such attempts have resulted in added noise, added dark current and dark noise, added source follower noise, and are not conducive to the proven, low-noise 4T pixel design. Furthermore, such designs do not make efficient use of electrical elements present in their design, using more components than is necessary to operate, thus increasing the size of the circuits, limiting the achievable pixel density and performance thereof.

These faults are, at least in part, a result of the significant differences in the challenges associated with capturing scenes using data having significantly different wavelengths. For instance, when attempting to capture data concerning electromagnetic radiation in the visible, near infrared, or shortwave infrared portion of the spectrum, dark areas are photon starved, making it challenging to detect low photon flux events. Conversely, when attempting to capture data concerning electromagnetic radiation in the thermal infrared portion of the spectrum, the challenge becomes distinguishing a small signal overlaid on top of a large background.

What is needed, therefore, is a pixel with good low-light sensitivity that combines synchronous and asynchronous event-driven readouts, allows for simultaneous synchronous and asynchronous operation, provides a lower-power system approach that is conducive to 4T pixel design, captures detailed scene context, and provides inter-frame scene dynamic updates, at higher effective frame rates than is currently possible, without adding substantial noise to the system while reducing the number of components utilized.

SUMMARY

The present disclosure provides a system and method for combining synchronous and asynchronous readouts that allows the realization of a relatively low power system that is able to capture detailed scene context while reducing the number of components required and providing inter-frame scene dynamic updates at much higher effective frame rates than is currently possible using purely synchronous techniques. This low-power, dual-modality readout could benefit highly sensitive cooled imaging systems for missile warning and remote sensing applications and expand the capabilities of current dual-mode active and passive imagers, among other applications.

More specifically, a power-efficient approach to combining a traditional frame-based readout with an event-driven readout is proposed. One advantage of this dual-mode pixel is that it enables both readout modalities to operate independently and simultaneously. System power, in embodiments, is reduced by at least on order of magnitude by performing full frame capture at low frame rate and high sensitivity to provide scene context and subsequently coupling this information with an Inertial Measurement Unit (IMU) for synchronizing overall scene motion.

In addition to low power usage, embodiments of the present disclosure also beneficially provide low latency, reduced temporal and spatial redundancies, and do not require a synchronous system clock.

One embodiment of the present disclosure provides a hybrid frame-based and event driven pixel, the pixel comprising: a frame-based capture circuit; an event-driven capture circuit; and a photodiode in electrical communication with both the frame-based and event-driven capture circuits, wherein the frame based capture circuit is a buffered direct injection circuit, and wherein the event-driven capture circuit is a dynamic vision system circuit.

Another embodiment of the present disclosure provides such a hybrid frame-based and event driven pixel wherein the dynamic vision system circuit comprises three stages: a first stage comprising the photodiode, which is shared with the frame-based capture circuit, and an amplifier configured to stabilize voltage across the photodiode and create a voltage signal proportional to the log of light intensity incident thereon; a second stage configured to act as a differencing circuit, rejecting a DC component of the voltage signal created by the amplifier of the first stage upon a reset of the first stage; and a third stage configured to detect changes in the signal and produce digital events based thereon.

A further embodiment of the present disclosure provides such a hybrid frame-based and event driven pixel wherein the buffered direct injection circuit comprises: the photodiode, which is shared with the event-based capture circuit; an integration capacitor; an injection transistor; a reset transistor; an output selection transistor; and an inverting gain module disposed between the photodiode and a gate of the injection transistor.

Yet another embodiment of the present disclosure provides such a hybrid frame-based and event driven pixel wherein the gain module comprises an inverter circuit.

A yet further embodiment of the present disclosure provides such a hybrid frame-based and event driven pixel wherein the gain module is configured to provide feedback that allows for control over photodetector bias at different photocurrent levels.

Still another embodiment of the present disclosure provides such a hybrid frame-based and event driven pixel wherein the buffered direct injection circuit is shielded from control signals used in the dynamic vision system circuit.

A still further embodiment of the present disclosure provides such a hybrid frame-based and event driven pixel wherein the pixel design is selected from the group consisting of: a monolithic, silicon-based pixel; a hybrid design, comprising a focal plane array comprising photodiodes that form an array in one substrate that is bonded to a complementary metal oxide semiconductor readout in a second substrate with one or more contacts per pixel to provide electrical contacts; and a stacked design.

Even another embodiment of the present disclosure provides such a hybrid frame-based and event driven pixel wherein the pixel comprises relatively large explicit capacitors configured to provide linear response characteristics.

An even further embodiment of the present disclosure provides such a hybrid frame-based and event driven pixel wherein the photodetector is flip-chip bump bonded to a silicon complementary metal oxide semiconductor readout chip.

A still even another embodiment of the present disclosure provides such a hybrid frame-based and event driven pixel wherein the photodetector is laminated loop-hole bonded to a silicon complementary metal oxide semiconductor readout chip.

A still even further embodiment of the present disclosure provides such a hybrid frame-based and event driven pixel further comprising a pipeline storage element configured to allow for a true integrate-while-readout mode of operation.

Still yet another embodiment of the present disclosure provides such a hybrid frame-based and event driven pixel wherein the photodetector material is selected from the group of materials consisting of InGaAs, InSb, and HgCdTe, and SLS and nBn structured sensors.

A still yet further embodiment of the present disclosure provides such a hybrid frame-based and event driven pixel wherein the photodetector is a quantum-based photodetector.

Even yet another embodiment of the present disclosure provides such a hybrid frame-based and event driven pixel further comprising an inertial measurement unit configured to trigger the frame-based capture circuit upon detection of movement exceeding a predetermined threshold level.

One embodiment of the present disclosure provides a method of obtaining imagery, the method comprising: using a focal plane array comprising a plurality of pixels, each pixel comprising: a frame-based capture circuit; an event-driven capture circuit; and a photodiode in electrical communication with both the frame-based and event-driven capture circuits, wherein the frame based capture circuit is a buffered direct injection circuit, and wherein the event-driven capture circuit is a dynamic vision system circuit, capturing largely static images using the frame-based capture circuit; and capturing the motion of relatively fast-moving objects using the event-driven capture circuit.

Another embodiment of the present disclosure provides such a method of obtaining imagery wherein the frame-based capture circuit is configured to capture images at a relatively low frame rate.

A further embodiment of the present disclosure provides such a method of obtaining imagery wherein the event-driven capture circuit is configured to capture events at a relatively high frame rate.

Yet another embodiment of the present disclosure provides such a method of obtaining imagery further comprising determining a pixel address by accessing a row and column bus structure using a decoding network.

A yet further embodiment of the present disclosure provides such a method of obtaining imagery wherein the focal plane array is configured to perform hierarchical 2-D row-first, column-second arbitration.

One embodiment of the present disclosure provides a hybrid frame-based and event driven pixel, the pixel comprising: a frame-based capture circuit; an event-driven capture circuit; an inertial measurement unit configured to trigger the frame-based capture circuit upon detection of movement exceeding a predetermined threshold level; a pipeline storage element configured to allow for a true integrate-while-readout mode of operation; and a photodiode in electrical communication with both the frame-based and event-driven capture circuits, wherein the frame based capture circuit is a buffered direct injection circuit, wherein the event-driven capture circuit is a dynamic vision system circuit, and wherein the buffered direct injection circuit is shielded from control signals used in the dynamic vision system circuit.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

As a preliminary matter, three configurations for solid-state imagers are discussed herein. The first, which is described herein as monolithic, silicon-based construction, refers to a Focal Plane Array (FPA) where photodiodes in the pixel array are silicon-based and fabricated in the same wafer as CMOS circuitry. A second configuration, which is herein referred to as a hybrid design, describes an FPA where photodiodes form an array in a non-silicon semiconductor material that is bonded to a CMOS readout with one or more contacts per pixel to provide electrical contacts. The final design is herein referred to as a stacked configuration and describes an FPA having photodiodes fabricated in a silicon-based substrate that can be integrated with simple MOS circuitry and then bonded to a readout circuit fabricated in a separate substrate.

As described in the background section, conventional imagers are based on the use of a fixed capture interval, and are herein referred to as "Frame based" or synchronous imagers 300. In such imagers, a Region of Interest (ROI) or the entire array of pixels, the FPA, is read out at every frame.

The readout of such conventional, frame-based imagers 300 includes both spatial and temporal redundancies, as not all data has changed between frames. This replication of data and readout of more information than is necessary can result in data bottlenecks for large format high frame rate imagers. Furthermore, reading out the entire array every frame results in high power dissipation requirements, much of which is wasted transferring redundant information off of the FPA, and also results in large storage requirements.

Frame-based imagers 300, however, do offer some significant benefits over event-driven imagers 400. For instance, frame-based imagers 300 offer full two dimensional coverage of the scene with high sensitivity from low to high intensity detector signals, down to the read noise level, albeit at the expense of high power and large storage requirements. Unlike event driven imagers 400, there is no minimum threshold level which must be traversed before a pixel measurement is made.

The temporal sensitivity of frame-based imagers 300 is directly proportional to the frame rate and exposure time. The dynamic range of such imagers is limited to the signal capacity of the input cell, which is typically <60 dB for single gain mode, but this can be higher if digital FPAs are used. The dynamic range of frame-based imagers 300 can also be extended using gain compression response or dual-gain architecture.

Figure 1:
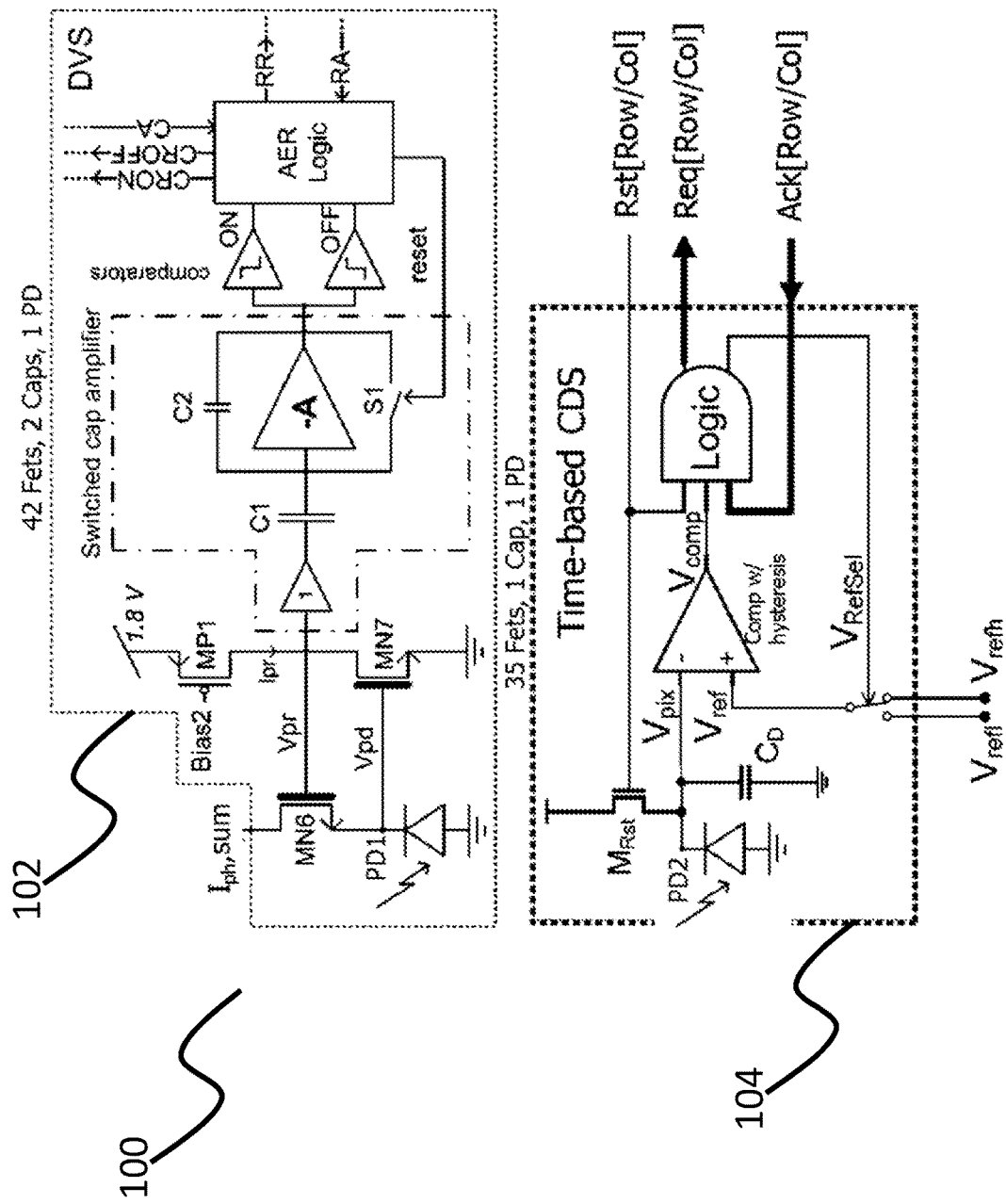
FIG. 1 is a schematic showing a prior art Asynchronous Time Based Sensor (ATIS)
Figure 2:
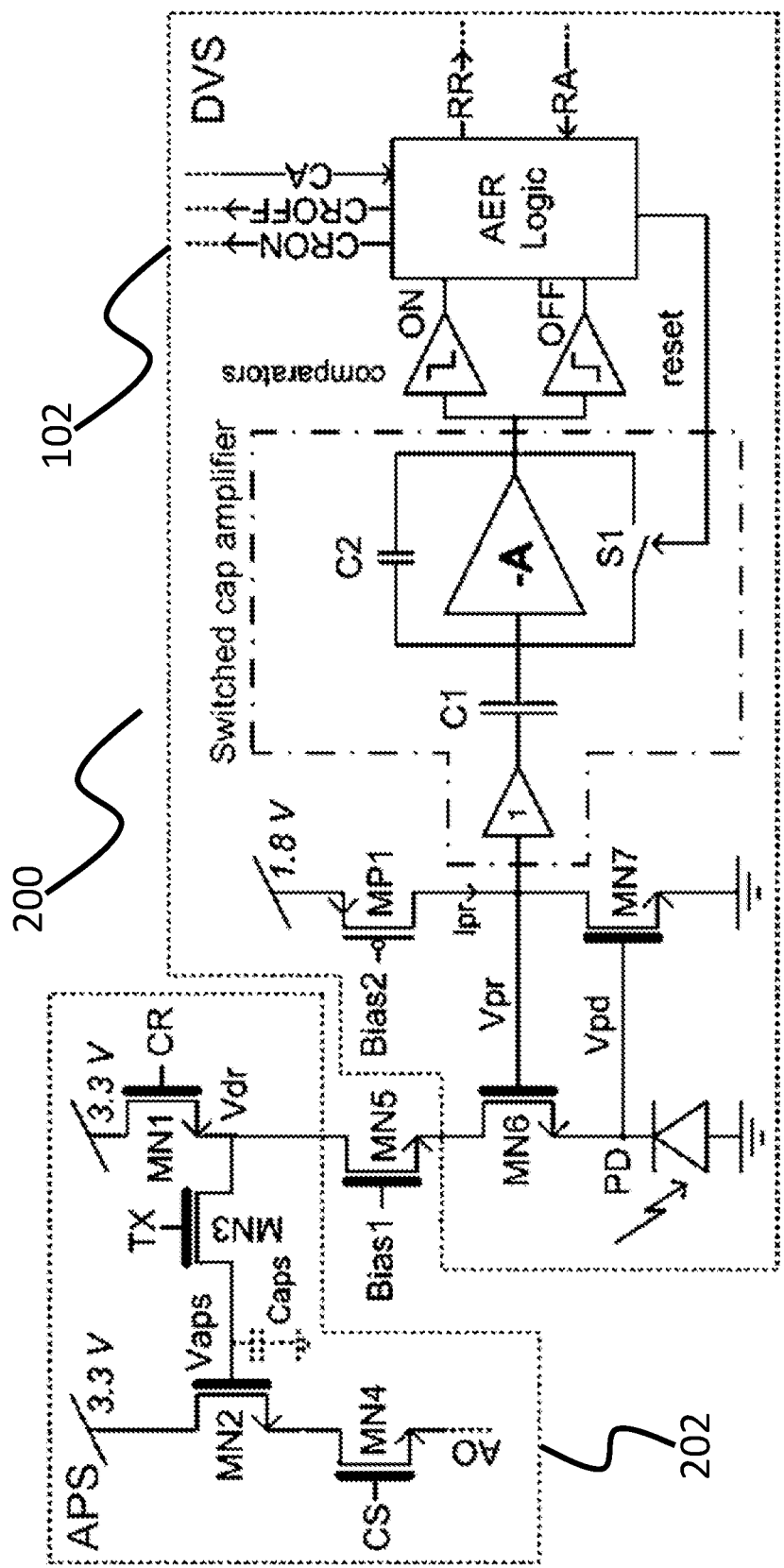
FIG. 2 is a schematic showing a prior art Dynamic and Active-Pixel Vision Sensor (DAVIS)
Figure 3:
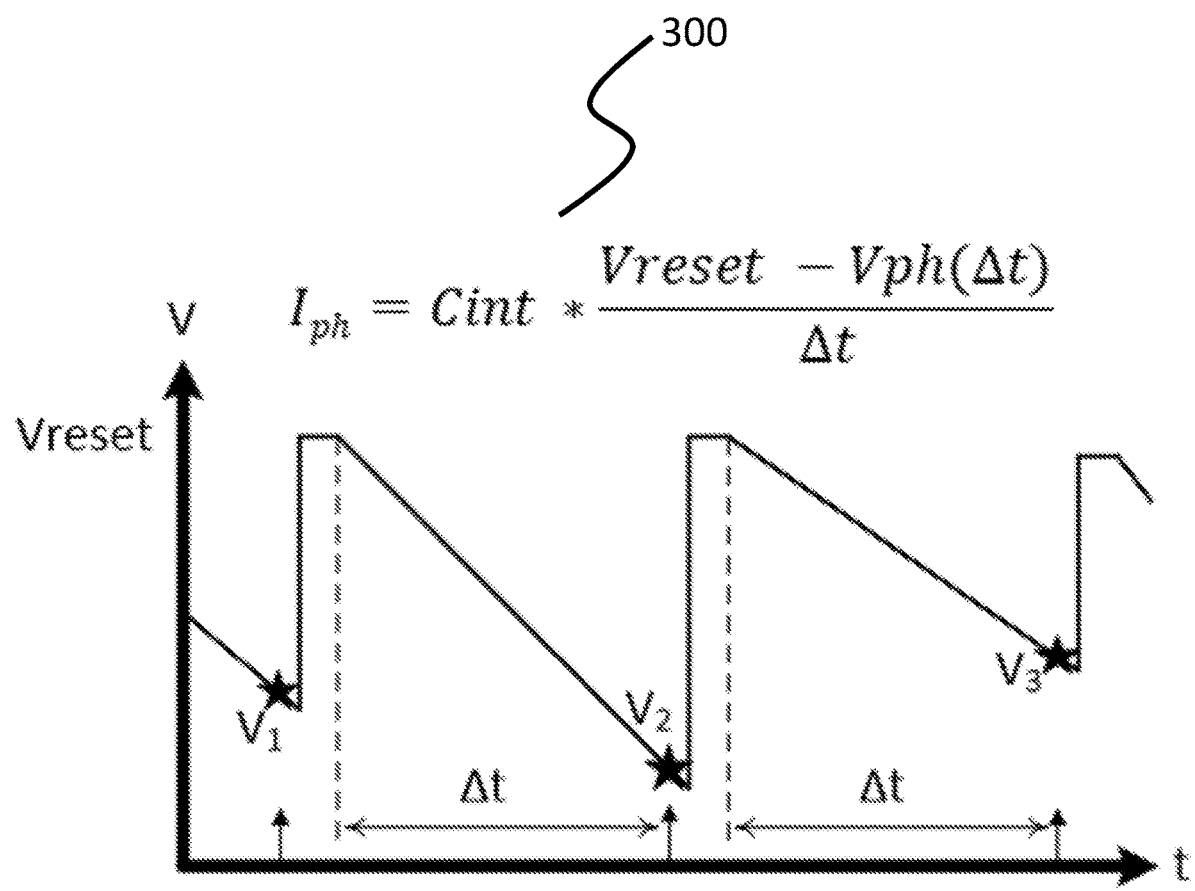
FIG. 3 is a graph describing the behavior of a classical, frame-based pixel.

FIG. 3 describes the function of a classical, frame-based imager 300 graphically. More specifically, frame based imagers 300 measure voltage on a given pixel over a known, fixed time interval, the integration period. Frame-based imagers 300 than quantize the voltage received during the fixed time interval, using it to generate a reproducible image. Notable features of frame-based imagers 300 that can be seen in FIG. 3 include full frame capture at fixed time intervals, including redundant spatial & temporal pixels and continuous clocking of all pixels.

In contrast to classical, frame-based imagers 300, event-driven or asynchronous imagers 400 only send out information, which may include pixel address, a time stamp, and measured intensity, when a discernable event occurs, e.g. when a threshold is exceeded. More specifically, event-driven readouts 400 are designed to output pixel information when a temporal change is sensed. This design: eliminates both spatial and temporal redundancies; reducing data throughput bandwidth while providing lossless data compression, by collecting only unique temporal scene information. This significantly reduces power requirements in the imager and in the FPA signal processing chain.

Figure 4:
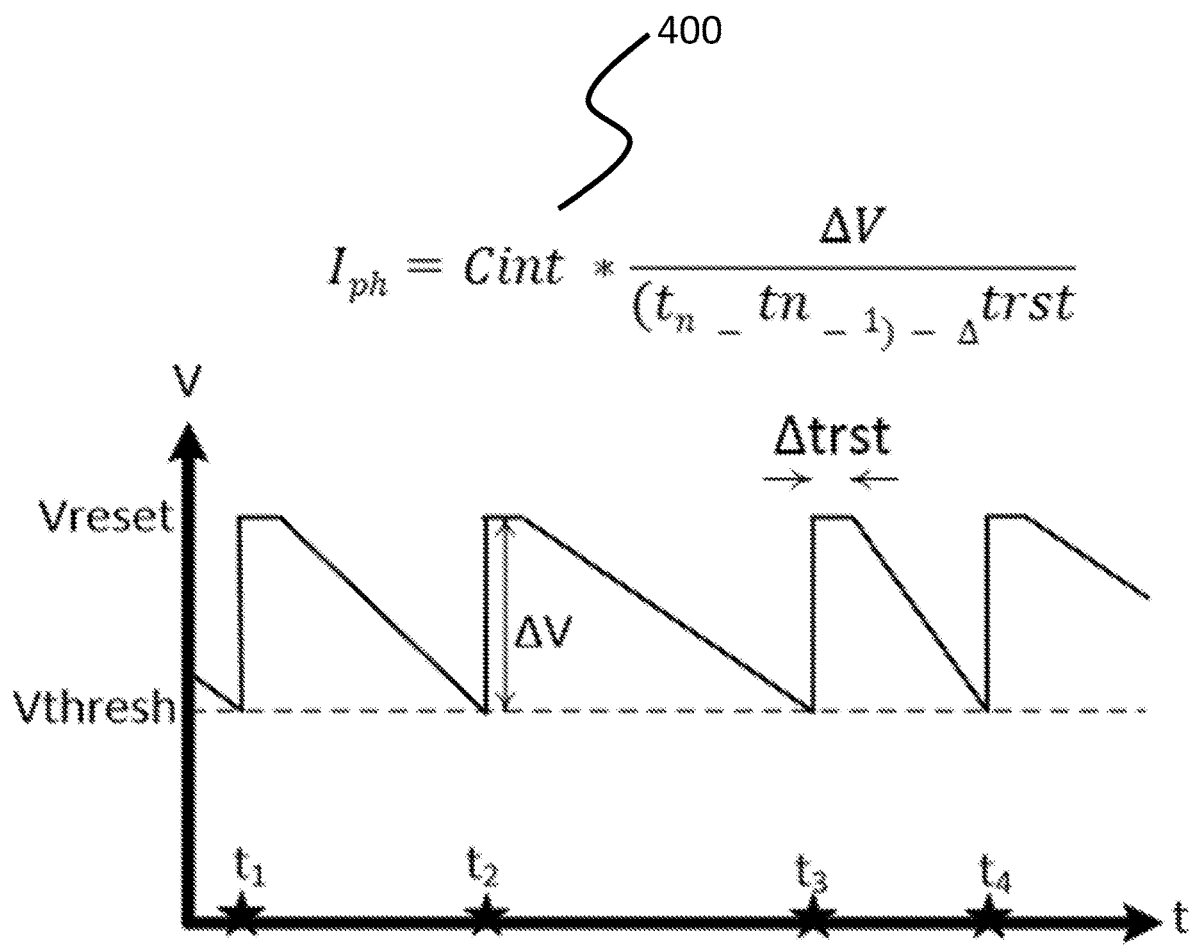
FIG. 4 is a graph showing the behavior of an event-driven pixel.

Event-driven imagers 400 operate by measuring the time duration required for the sensor signal to change by a preset amount, effectively quantizing time, as graphically-described in FIG. 4. Such imagers are typically based on pulse modulation, which is used to convert intensity change to time. Events are determined when a pre-determined threshold is exceeded, either positive or negative; this is a measure of the temporal contrast. Each pixel event is conveyed to the output with the event arrival time and the pixel location, both row and column indices, and is referred to as an Asynchronous Event Readout (AER). Directional contrast changes can also be conveyed through the AER using an additional event bit. More than 6-orders of magnitude (>120 dB) dynamic range is possible with such imagers and minimum contrast thresholds as low as 1.5% have been demonstrated.

Furthermore, event-driven imagers 400 only read individual pixels that incur an event, typically using AER, in serial or parallel readout, dependent on design requirements. Because pixels reach the threshold voltage at varying times, readout is asynchronous, immediate, and pixel-specific, as opposed to the FPA-wide readout of a classical, frame-based, synchronous imager 300, conserving bandwidth and power and/or allowing for higher effective framerates, which can be 100's of KHz with response times as short as 3 μs.

Figure 5:
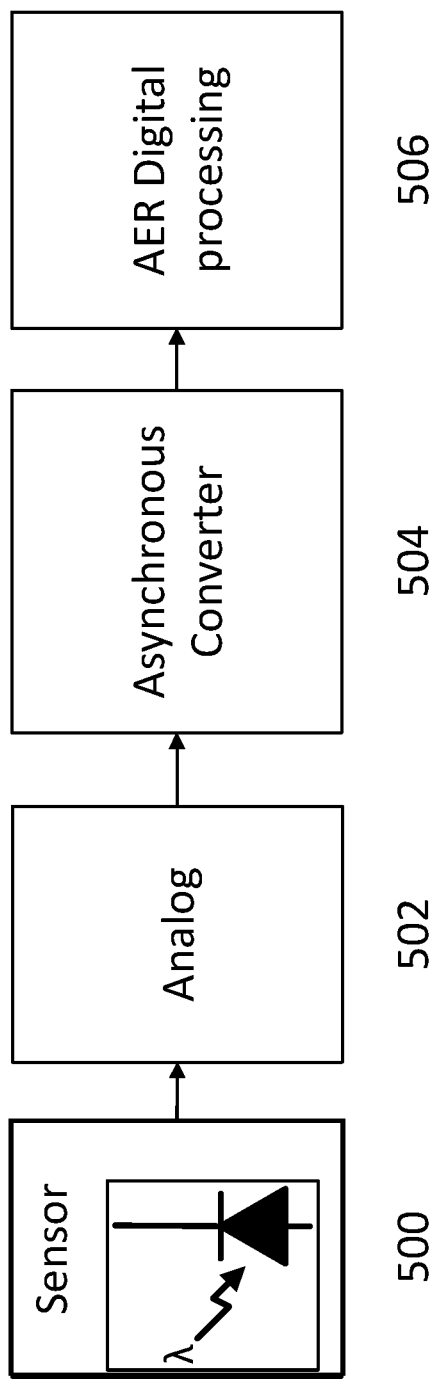
FIG. 5 is flowchart illustrating the high-level design of a pixel in accordance with embodiments of the present disclosure.

FIG. 5 provides a flowchart illustrating the high-level design of an asynchronous, event-driven input unit cell (i.e. pixel cell), in accordance with embodiments of the present disclosure. In other words, the figure describes time-domain photo-transduction, in accordance with embodiments of the present disclosure. The sensor 500, in embodiments, may be a quantum-based detector (e.g. photodiode) with a fast response time. In embodiments, the sensor 500 is made from silicon, InGaAs, InSb, HgCdTe, Strain Layer Superlatices (SLS) and semiconductor-barrier-semiconductor (nBn) structured sensors, and/or nanoparticles. The sensor 500 output is then transferred to an analog module 502, which may measure individual photon response, linear response (e.g. 3T APS), or logarithmic response and which may be further configured to amplify sensor 500 output and/or perform correlated double sampling thereon. The output of the analog module 500 is then transferred to an asynchronous converter module 504 which, in embodiments, performs differentiation and/or threshold comparison. Finally, the output from the asynchronous converter module 504, in embodiments, is provided to an AER digital processing module 506 that, in embodiments, determines the direction of signal change, allowing for temporal differencing, conveys the pixel address to another module, and/or performs AER readout handshaking, including sending row and column event requests, receiving row and column acknowledgements, and resetting pixels following acknowledgements.

Event-driven pixels 400 have a number of benefits, including lower power and bandwidth requirements, compared to classical, frame-based pixels 300, although they trade intensity (i.e. contrast) and sensitivity (i.e. threshold level) to gain these benefits. In addition, such pixels allow for a relatively large dynamic range, which can be extended using gain compression. Event-driven pixels 400 also allow Gamma correction through monotonic variation of the threshold level.

Event-driven sensors 400 primarily consist of three types: those that react to a change in the linear pixel response, those that measure a single photon incident on a pixel, and those that react to a logarithmic response. Logarithmic response pixels provide moderate background noise and a large dynamic range. Such event-driven imagers 400 typically utilize a subthreshold Field Effect Transistor (FET) to maintain detector bias in a feedback loop comprising a high gain inverting amplifier configured to maintain a fixed photodiode bias voltage. The gate to source voltage of this FET varies proportionally to the natural logarithm of the current generated by the detector, including photo-generated and dark currents. During use, a small change in detector current introduces a voltage change that is amplified and fed back to the gate of the FET, which quickly adjusts to provide the FET current necessary maintain a fixed detector bias. A predetermined change in this gate voltage then triggers the pixel readout event, which outputs the pixel 2-D address and time of event.

Single photon response event-driven imagers 400 provide low background noise and moderate dynamic range. These sensors are used, among other things, for photon counting, in such devices as single-photon avalanche diodes (SPADs, AKA Geiger mode APDs), which are solid-state photodetectors in which a photon-generated carrier (via the internal photoelectric effect) can trigger a short-duration, but relatively large, avalanche current. Essentially, each photon registers as an event and its pixel address is sent off-chip. Photon events are then counted off-chip. Such a technique is ideal for low light applications and between 20 and 100 million events/second are possible using such techniques. Unfortunately, dark shot noise, which is a result of dark leakage current in the image sensor, is also registered as an event and must be taken into account, which can limit sensitivity.

Lastly, linear response event-driven imagers 400 provide moderate background noise and dynamic range and function by measuring the time to a first crossing. In such event-driven imagers, detector current is integrated onto a capacitor, and when the integrated voltage exceeds a pre-determined threshold an event is triggered and the capacitor is reset. This design behaves like a one-bit Analog-to-Digital Converter (ADC) or sigma delta converter in each cell. Each event is immediately transmitted off-chip along with the pixel address.

Two sub-types of linear response asynchronous, event-driven pixels 400, both of which use pulse modulation techniques are: Time to first spike (TFS) after last reset (Pulse width Modulation); and Spiking Pixel case, Frequency of spikes (Frequency Modulation, FM), which can lead to event crowding.

In all event-driven imagers 400, the threshold voltage value is inversely correlated to acquisition speed and pixel resolution. Choosing a threshold voltage value relatively close to the reset voltage provides a relatively short integration time, which increases the event rates and power dissipation, but decreases the picture resolution by obscuring other pixels during a "handshake" time, during which information is being transferred. Furthermore, in event-driven imagers 400 highly illuminated areas present fast update rates and high dynamic range, while lower light areas suffer from motion artifacts and limited dynamic range.

While event-driven imagers 400 are ideal for highlighting changes in a scene over time, such as target tracking, or navigating busy streets, detailed scene texture information is generally lost due to the resolution threshold limitations of such sensors.

By augmenting classical, frame-based imagers 300 with asynchronous, event-driven readout 400 using threshold sensing, as described herein, the benefits of event-driven imager 400 design can be obtained without incurring the disadvantages of such technology.

More specifically, embodiments combine event-driven logarithmic sensing with conventional, frame-based imaging 300. In embodiments conventional imaging 300 is used for scene content analysis while event-driven imaging 400 is used to measure temporal contrast events for target tracking, fast inter-frame update rates, and/or guide ROIs for readout. These embodiments offer reduced power usage with lower frame capture rates and low latency for changes in scene.

Figure 6:
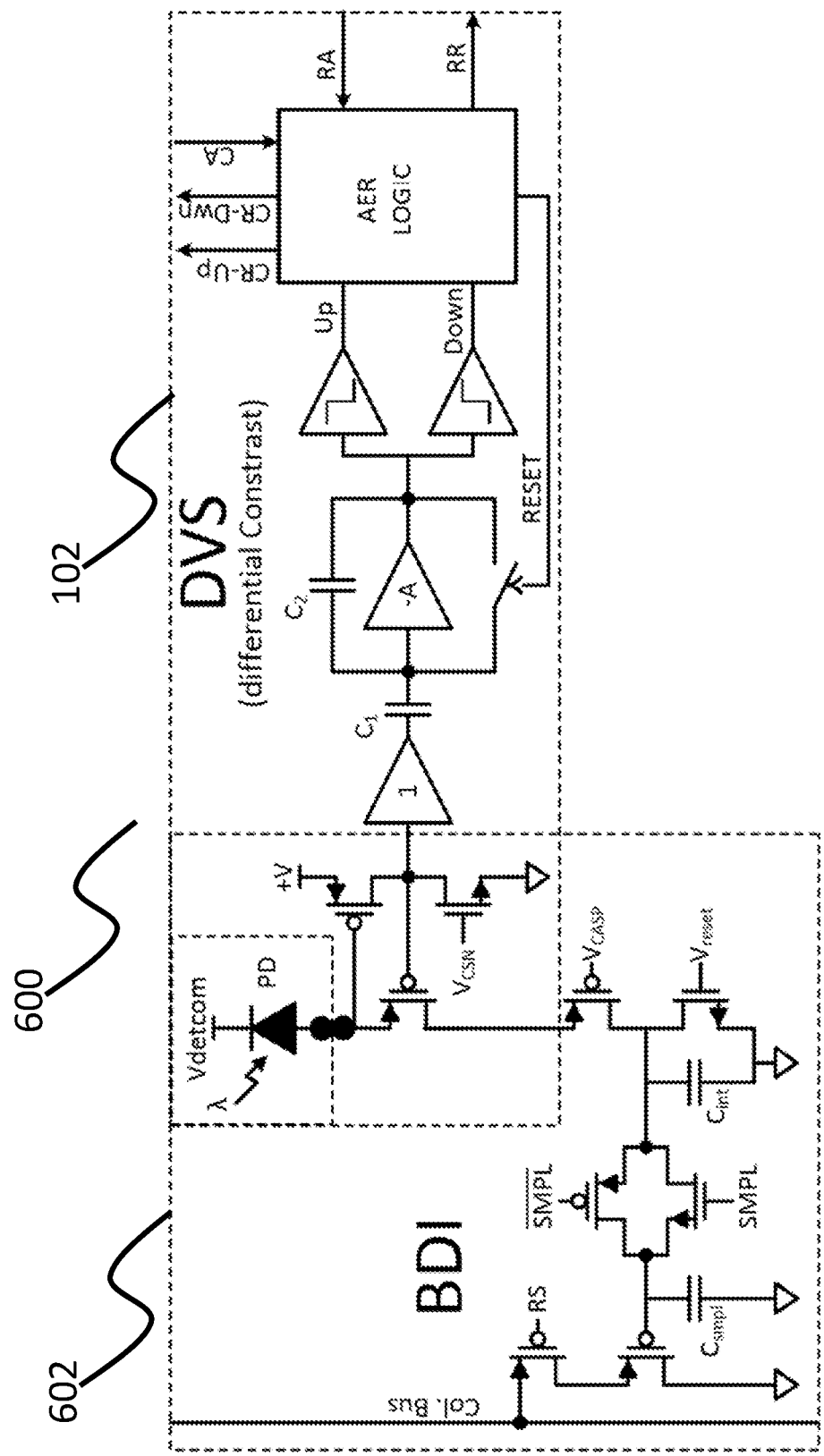
FIG. 6 is a schematic showing an embodiment of a pixel in accordance with the present disclosure.

Now referring to FIG. 6, a Buffered Direct Injection (BDI) 602 and Dynamic Vision System (DVS) 102 hybrid pixel 600, in accordance with embodiments of the present disclosure, is shown, schematically.

Figure 7:
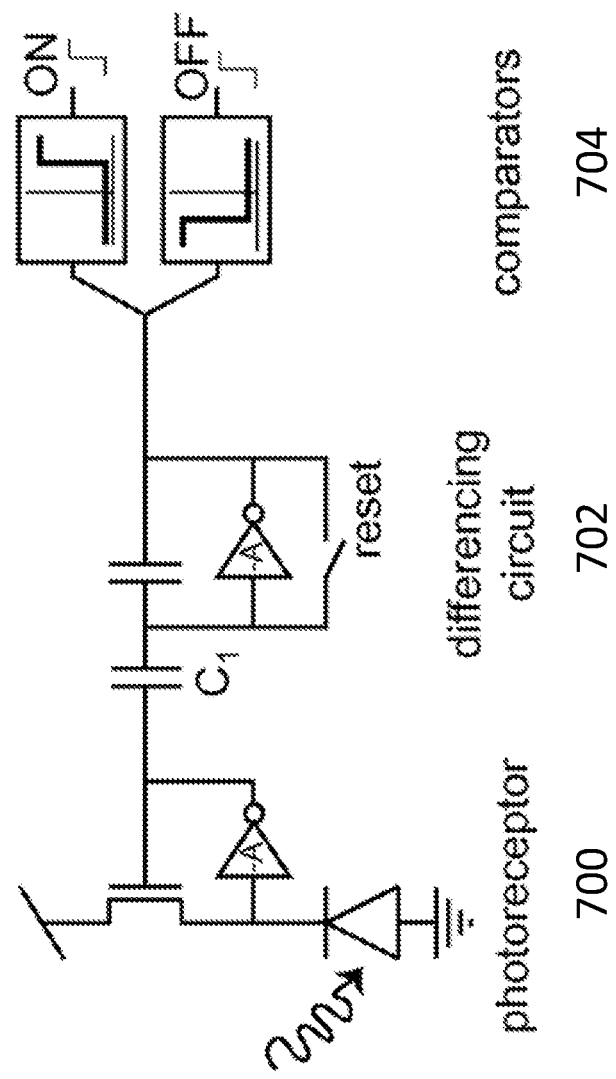
FIG. 7 is a schematic showing an abstracted view of a DVS pixel design, in accordance with embodiments of the present disclosure.

For clarity, a schematic showing an abstracted view of a DVS pixel 102 design is shown in FIG. 7. In FIG. 7, the DVS pixel 102 is shown to comprise three primary sections. The first stage is the photoreceptor 700 stage, which includes an amplifier configured to stabilize voltage across the photodiode and create a voltage signal proportional to the log of the light intensity. The second stage acts as a differencing circuit 702, rejecting the DC component of the voltage signal created by the photoreceptor stage whenever it is reset, so that the resulting signal does not carry information about the absolute level of illumination. The third comparators stage 704 detects changes in the light-related signal and produces digital events (ON means the light got brighter and OFF means it got dimmer).

Now regarding BDI circuits 602, a BDI circuit 602 is similar to a Direct Injection (DI) unit cell, which consists of an integration capacitor, an injection transistor, a reset transistor, and an output selection transistor. A BDI unit cell 602 differs from a DI unit cell in that inverting gain is provided between the detector and the injection transistor gate in a BDI unit cell 602. The gain can be achieved, for example, by using a simple inverter circuit. The inverted gain provides feedback to yield better control over the detector bias at different photocurrent levels.

In the pixel of FIG. 6, the BDI stage 602 is uncompromised in performance, as long as it is well shielded from the DVS 102 control signals and can operate at low frame rate to save power. Furthermore, the DVS 102 provides differential contrast thresholding events and, in embodiments, has six orders of magnitude of dynamic range, operates independent of the BDI frame based imaging 602, which can be operated simultaneously therewith and provide multiple target, inter-frame, high-speed tracking information and single ping, active imagery capture, allowing for true 3-D rendering. Notably, the presence of linear capacitors, C1 and C2, in the design allows for background subtraction capabilities.

In embodiments, the BDI/DVS hybrid pixel 600 shown in FIG. 6 is a monolithic, silicon-based pixel. In other embodiments, the BDI/DVS hybrid pixel 600 is of a hybrid design, comprising an FPA where photodiodes form an array on a one substrate that is bonded to a CMOS readout on a second substrate with one or more contacts per pixel to provide electrical contacts. In still other embodiments, the BDI/DVS hybrid pixel 600 is of a stacked design.

In embodiments, BDI/DVS hybrid pixel 600 shown in FIG. 6 incorporates large explicit capacitors, $C_{int}$ and $C_{smpl}$, to provide linear response characteristics, and high charge capacities. The integration capacitor integrates the detector current converting the signal to a voltage. The sample transmission switch and the $C_{smpl}$ capacitor provides analog storage and enables integrate-while-read capability. Additionally, background subtraction can be implemented by controlling the sample switch to be a potential barrier and the charge in $C_{int}$ pushed over this barrier with a voltage ramp tied to the source of $V_{reset}$ FET instead of a constant DC voltage.

In embodiments, the BDI stage 602 operates at a low frame rate to save power.

In embodiments, timing is assigned by an external clock upon the receipt of an event request.

In embodiments, a pixel address is determined through accessing a row and column bus structure using a decoding network.

Regarding asynchronous event channel capacity, at high event rates the probability of event collision occurring on a bus increase, at which point timing data can be lost or misinterpreted. For example, unfettered channel access only allows the use of 18% of total channel capacity before a collision occurs, on average, once for every ten events. In embodiments, contention occurs if two or more events attempt to transmit simultaneously with random access to the shared communication channel, allowing corrupted transmissions to be detected and discarded. Unfettered access has a short cycle time, but collisions increase rapidly as the load increases.

In embodiments, when one or more rows request are received, almost simultaneously, a process referred to as arbitration is used to decide how to handle the information. A similar arbitration process is needed for the column pixels in each row. This operation is performed around the periphery of the pixel array.

Arbitration means the pixel events are queued and wait their turn for access to the shared bus. Embodiments utilize several forms of arbitration, including: Non-greedy—ensures that a row or column that is serviced by the arbiter is guaranteed not to be services again before all other rows and columns that have registered requests have been serviced; Greedy—If both inputs in an arbiter sub-cell are selected at the same time arbitration will service both before moving on to others (this local prioritization saves cycle time); and Fair—alternate priority, a toggle switch selects input A or input B first depending on its setting for a 2-input arbiter sub-cell (the toggle switch, in embodiments, is changed with acknowledge signals from higher arbiter stages).

In embodiments, hierarchical 2-D Row-First Column-Second Arbitration is used to save time by servicing all active event-triggered pixels in a chosen row before another row is picked.

In embodiments, handshaking is done to minimize pixel crowding on buses. One way of accomplishing this is through row dominate addressing (Row First Column Second), i.e. a pixel with an event first sends a request on the row line and then waits for acknowledgement, then each of the pixels in the row send out request on their bus lines. When column acknowledgement is received, the pixel is reset. Minimizing the handshake interval through pipelining is implemented in embodiments to minimize bus crowding.

In embodiments, the detector array substrate is flip-chip bump bonded while, in other embodiments, it is laminated loop-hole (DRS) to a silicon CMOS readout chip.

In embodiments, the detector can be configured to cover from UV to VLWIR bands.

In embodiments of the present disclosure, the BDI-based dual mode pixel 600 includes a pipeline storage element, allowing for true integrate while-readout mode of operation.

Additionally, a hybrid detector scheme used in embodiments opens up the spectral band to include not only silicon based visible/NIR, but also InGaAs, InSb, and HgCdTe, and SLS and nBn structured sensor for use in the infrared reflective and thermal bands.

In embodiments, changes within the scene are captured by the event-driven readouts 400, which provide inter-frame scene dynamics at an effective frame rate, which, in embodiments, is several orders of magnitude faster than current state of the art frame-based systems 300, while also saving considerable power.

In embodiments, quantum-based detectors, which can respond on the order of micro-seconds or less, are used to respond rapidly to intensity changes.

The foregoing description of the embodiments of the disclosure has been presented for the purposes of illustration and description. It is not intended to be exhaustive or to limit the disclosure to the precise form disclosed. Many modifications and variations are possible in light of this disclosure. It is intended that the scope of the disclosure be limited not by this detailed description, but rather by the claims appended hereto.

What is claimed is:

1. A hybrid frame-based and event driven pixel, the pixel comprising:
   a frame-based capture circuit;
   an event-driven capture circuit; and
   a photodiode in electrical communication with both the frame-based and event-driven capture circuits,
   wherein the frame-based capture circuit is a buffered direct injection circuit,
   wherein the event-driven capture circuit is a dynamic vision system circuit,
   wherein the pixel comprises an explicit integration capacitor, an explicit sample capacitor and a sample transmission switch configured to provide linear response characteristics and high charge capability.

2. The pixel of claim 1 wherein the dynamic vision system circuit comprises three stages:

a first stage comprising the photodiode, which is shared with the frame-based capture circuit, and an amplifier configured to stabilize voltage across the photodiode and create a voltage signal proportional to the log of light intensity incident thereon;

a second stage configured to act a differencing circuit, rejecting a DC component of the voltage signal created by the amplifier of the first stage upon a reset of the first stage; and a third stage comprising comparators configured to detect changes in the signal and a digital first event or a digital second event, wherein the digital first event occurs when the signal is ON and the digital second event occurs when the signal is OFF.

3. The pixel of claim 2 wherein the buffered direct injection circuit comprises:

the photodiode, which is shared with the event-based capture circuit;

an integration capacitor;

an injection transistor;

a reset transistor;

an output selection transistor; and an inverting gain module disposed between the photodiode and a gate of the injection transistor.

4. The pixel of claim 3 wherein the inverting gain module comprises an inverter circuit.

5. The pixel of claim 4 wherein the inverting gain module provides feedback that allows for control over photodiode bias at different photocurrent levels.

6. The pixel of claim 1 wherein the buffered direct injection circuit is shielded from control signals used in the dynamic vision system circuit.

7. The pixel of claim 1 wherein a design of the pixel is selected from a group consisting of: a monolithic, silicon-based pixel; a hybrid design, comprising a focal plane array comprising photodiodes that form an array in one substrate that is bonded to a complementary metal oxide semiconductor readout in a second substrate with one or more contacts per pixel to provide electrical contacts; and a stacked design.

8. The pixel of claim 1 wherein the photodiode is flip-chip bump bonded to a silicon complementary metal oxide semiconductor readout chip.

9. The pixel of claim 1 wherein the photodiode is laminated loop-hole bonded to a silicon complementary metal oxide semiconductor readout chip.

10. The pixel of claim 1 further comprising a pipeline storage element configured to allow for a true integrate-while-readout mode of operation by row dominate addressing.

11. The pixel of claim 1 wherein a material of the photodiode is selected from a group of materials consisting of InGaAs, InSb, and HgCdTe, and SLS and nBn structured sensors.

12. The pixel of claim 1 wherein the photodiode is a quantum-based photodetector.

13. The pixel of claim 1, further comprising a background subtraction by controlling the sample transmission switch to be a potential barrier and a charge in the integration capacitor is pushed over the potential barrier with a voltage ramp tied to a source of a Vreset transistor.

14. A method of obtaining imagery, the method comprising: using a focal plane array comprising a plurality of pixels, each pixel comprising:

a frame-based capture circuit; an event-driven capture circuit; and a photodiode in electrical communication with both the frame-based and event-driven capture circuits, wherein the frame-based capture circuit is a buffered direct injection circuit, and wherein the event-driven capture circuit is a dynamic vision system circuit, capturing largely static images using the frame-based capture circuit; and capturing motions of fast-moving objects using the event-driven capture circuit.

15. The method of claim 14 wherein the frame-based capture circuit is configured to capture images at a low frame rate.

16. The method of claim 14 wherein the event-driven capture circuit is configured to capture events at a high frame rate.

17. The method of claim 14 further comprising determining a pixel address by accessing a row and column bus structure using a decoding network.

18. The method of claim 14 wherein the focal plane array is configured to perform hierarchical 2-D row-first, column-second arbitration.

19. A hybrid frame-based and event driven pixel, the pixel comprising:

a frame-based capture circuit;

an event-driven capture circuit;

a pipeline storage element configured to allow for a true integrate-while-readout mode of operation by row dominate addressing; and a photodiode in electrical communication with both the frame-based and event-driven capture circuits, wherein the frame-based capture circuit is a buffered direct injection circuit, wherein the event-driven capture circuit is a dynamic vision system circuit, wherein the buffered direct injection circuit is shielded from control signals used in the dynamic vision system circuit, and wherein the pixel comprises an explicit integration capacitor, an explicit sample capacitor and a sample transmission switch configured to provide linear response characteristics and high charge capability.

* * * * *